United States Patent
Mauer et al.

(10) Patent No.: US 9,337,782 B1
(45) Date of Patent: May 10, 2016

(54) METHODS AND APPARATUS FOR ADJUSTING TRANSMIT SIGNAL CLIPPING THRESHOLDS

(71) Applicant: Altera Corporation, San Jose, CA (US)

(72) Inventors: Volker Mauer, Princes Risborough (GB); Nima Safari, High Wycombe (GB); Shahin Gheitanchi, Maidenhead (GB); Richard Maiden, Menlo Park, CA (US)

(73) Assignee: Altera Corporation, San Jose, CA (US)

( * ) Notice: Subject to any disclaimer, the term of this patent is extended or adjusted under 35 U.S.C. 154(b) by 71 days.

(21) Appl. No.: 14/283,703

(22) Filed: May 21, 2014

(51) Int. Cl.
| | | |
|---|---|---|
| *H04B 1/04* | (2006.01) | |
| *H03F 1/32* | (2006.01) | |
| *H03F 3/19* | (2006.01) | |
| *H03F 3/24* | (2006.01) | |
| *H04L 27/34* | (2006.01) | |

(52) U.S. Cl.
CPC .............. *H03F 1/3247* (2013.01); *H03F 3/19* (2013.01); *H03F 3/245* (2013.01); *H03F 2200/451* (2013.01); *H03F 2201/3227* (2013.01); *H04B 2001/0425* (2013.01); *H04L 27/3411* (2013.01)

(58) Field of Classification Search
CPC ... H03F 1/3241; H03F 1/3247; H03F 1/3252; H03F 1/3282; H03F 2001/3227; H03F 2001/3233; H04L 27/2623; H04L 27/3411; H04L 27/367; H04L 27/368; H04B 2001/0425; H04B 2001/0433
USPC .............. 455/114.3, 115.1, 126, 127.1, 127.2
See application file for complete search history.

(56) References Cited

U.S. PATENT DOCUMENTS

| | | | |
|---|---|---|---|
| 6,175,270 B1 * | 1/2001 | Vannucci | H03F 1/3241 |
| | | | 330/149 |
| 6,175,551 B1 | 1/2001 | Awater et al. | |
| 7,061,991 B2 | 6/2006 | Wright et al. | |
| 7,142,831 B2 | 11/2006 | Anvari | |
| 7,590,198 B2 | 9/2009 | Sanada et al. | |
| 7,634,024 B2 | 12/2009 | Tan | |
| 7,697,591 B2 | 4/2010 | Copeland | |

(Continued)

OTHER PUBLICATIONS

Cope, U.S. Appl. No. 13/625,782, filed Sep. 24, 2012.

(Continued)

*Primary Examiner* — Duc M Nguyen
(74) *Attorney, Agent, or Firm* — Treyz Law Group, P.C.; Michael H. Lyons

(57) ABSTRACT

Integrated circuits are provided with wireless communications circuitry having digital predistortion (DPD) circuitry, peak canceling circuitry, a power amplifier, and signal conditioning circuitry for controlling the DPD and peak canceling circuitry. The peak canceling circuitry may receive transmit signals and may clip peaks in the transmit signals that exceed a magnitude threshold value. The DPD circuitry may compensate for non-linear characteristics of the power amplifier by outputting a predistorted version of the clipped transmit signals. The power amplifier may receive the predistorted signals and may perform amplification to generate amplified signals. The signal conditioning circuitry may identify power transfer characteristics of the power amplifier and DPD circuitry using the predistorted signals and the amplified signals. The signal conditioning circuitry may update the magnitude threshold value imposed by the peak canceling threshold based on the identified power transfer characteristics to mitigate out-of-band spectral regrowth in the predistorted signals.

23 Claims, 6 Drawing Sheets

(56) References Cited

U.S. PATENT DOCUMENTS

| | | |
|---|---|---|
| 7,983,327 B2 | 7/2011 | Brobston |
| 8,446,979 B1 | 5/2013 | Yee |
| 8,599,961 B2 | 12/2013 | Schmidt et al. |
| 2003/0022639 A1* | 1/2003 | Hongo ............... H04L 27/2623 455/116 |
| 2005/0163252 A1* | 7/2005 | McCallister ......... H03F 1/3247 375/296 |
| 2006/0062057 A1 | 3/2006 | Blasi et al. |
| 2006/0067426 A1* | 3/2006 | Maltsev ............. H04L 27/2602 375/297 |
| 2007/0018722 A1* | 1/2007 | Jaenecke ............ H03F 1/3247 330/149 |
| 2008/0049868 A1* | 2/2008 | Brobston ............ H04L 27/368 375/297 |
| 2009/0140806 A1* | 6/2009 | Shako ................ H03F 1/3247 330/149 |
| 2010/0158155 A1* | 6/2010 | Borkar ............... H03F 1/3247 375/297 |
| 2011/0285460 A1* | 11/2011 | Murao ................ H04B 1/0483 330/124 R |
| 2012/0082262 A1 | 4/2012 | Janani et al. |
| 2012/0163489 A1 | 6/2012 | Ramakrishnan |
| 2013/0342271 A1* | 12/2013 | Yu ..................... H03F 1/3247 330/149 |
| 2014/0044215 A1* | 2/2014 | Mundarath ........ H04L 27/2624 375/297 |
| 2014/0065986 A1* | 3/2014 | McCallister ......... H03F 1/3247 455/91 |
| 2014/0328431 A1* | 11/2014 | Haddad ............ H04L 25/03859 375/296 |

OTHER PUBLICATIONS

Mauer et al., U.S. Appl. No. 13/947,620, filed Jul. 22, 2013.
M. Weiβ, "Measuring the Dynamic Characteristic of High-Frequency Amplifiers with Real Signals", Proceedings of European wireless 2000, pp. 67.
Boumaiza et al., "Systematic and Adaptive Characterization Approach for Behavior Modeling and Correction of Dynamic Nonlinear Transmitters", IEEE Transactions on Instrumentation and Measurement, vol. 56, No. 6, Dec. 2007, pp. 2203-2211.
Mauer et al., U.S. Appl. No. 13/625,782, filed Sep. 24, 2012.

* cited by examiner

METHODS AND APPARATUS FOR ADJUSTING TRANSMIT SIGNAL CLIPPING THRESHOLDS

BACKGROUND

This relates generally to integrated circuits, and more particularly, to integrated circuits with wireless communications circuitry.

Integrated circuits with wireless communications capabilities typically include amplifying circuits that are used to amplify the power of radio-frequency signals prior to wireless transmission. For example, a radio-frequency power amplifier may receive input signals having an input power level and generate corresponding output signals having an output power level, where the output power level of the output signal is generally greater than the input power level of the input signal. Ideally, the power amplifier exhibits a perfectly linear input-output power transfer characteristic (i.e., an increase in the input power by a certain amount should result in a corresponding predetermined amount of increase in the output power). In practice, however, power amplifiers often exhibit non-linear behavior. When a power amplifier is non-linear, an increase in the input power may result in a corresponding increase in the output power that is less than the predetermined amount. Amplifier non-linearity issues can degrade signal integrity and adversely impact wireless performance.

Wireless integrated circuits such as transceiver circuits are sometimes configured to support complex, non-constant envelope modulation schemes such as the Wideband Code Division Multiple Access (W-CDMA) modulation scheme and the Orthogonal Frequency-Division Multiplexing (OFDM) modulation scheme. High frequency signals generated using such types of radio access technologies can exhibit high peak-to-average ratios (PARs), which can adversely impact the efficiency of radio-frequency power amplifiers used in wireless base transceiver stations (as an example).

It would therefore be desirable to provide improved wireless communications circuitry that can mitigate amplifier non-linearity while limiting peak-to-average ratios of transmitted signals.

SUMMARY

This relates generally to integrated circuits and, more particularly, to integrated circuits with wireless communications circuitry. The wireless communications circuitry on an integrated circuit may include at least a radio-frequency (RF) power amplifier, digital predistortion (DPD) circuitry for predistorting signals prior to amplification, peak canceling circuitry (e.g., crest-factor-reduction circuitry) for clipping transmit signals prior to predistortion, and signal conditioning circuitry that controls the peak canceling circuitry and the predistortion circuitry. The predistortion circuitry may be configured to compensate for any non-linear characteristics associated with the RF power amplifier. The predistortion circuitry may receive transmit signals and may output a predistorted version of the transmit signals. The power amplifier may receive the predistorted version of the transmit signals and may perform amplification to generate amplified transmit signals.

The peak canceling circuitry may receive the transmit signals from processing circuitry and may clip peaks in the transmit signals that exceed a magnitude threshold value prior to passing the clipped signals to the predistortion circuitry. The signal conditioning circuitry may adjust the magnitude threshold value based on a power transfer characteristic of the predistortion circuitry (e.g., based on a saturation power level specified by the power transfer characteristic of the predistortion circuitry) and/or a power transfer characteristic of the power amplifier (e.g., based on a saturation power level specified by the power transfer characteristic of the power amplifier). The signal conditioning circuitry may include filter coefficient calculation circuitry that analyzes signals received from the DPD circuitry and the power amplifier to compute filter coefficients for the predistortion circuitry. The predistortion circuitry may predistort the clipped signals using the computed filter coefficients.

The signal conditioning circuitry may monitor the performance of the power amplifier and/or the predistortion circuitry and may update the magnitude threshold level based on signals received from an output of the predistortion circuitry and an output of the power amplifier. For example, the signal conditioning circuitry may identify the power transfer characteristics of the power amplifier and/or the predistortion circuitry based on the signals received from the output of the predistortion circuitry and the output of the power amplifier. The signal conditioning circuitry may iteratively compute optimal magnitude threshold levels based on a linear combination of the saturation level of the predistortion circuitry and a current magnitude threshold level.

The signal conditioning circuitry may include error calculation circuitry that generates an error value (e.g., an error vector magnitude value) associated with signals amplified by the power amplifier. The signal conditioning circuitry may determine whether to adjust the magnitude threshold level based on the generated error value. For example, the signal conditioning circuitry may determine whether a difference value between the generated error value and a threshold error value is greater than a predetermined amount and may adjust the peak magnitude threshold level in response to determining that the difference value is greater than the predetermined amount.

Further features of the present invention, its nature and various advantages will be more apparent from the accompanying drawings and the following detailed description.

DETAILED DESCRIPTION

Embodiments of the present invention relate to integrated circuits with wireless communications circuitry. It will be recognized by one skilled in the art, that the present exemplary embodiments may be practiced without some or all of these specific details. In other instances, well-known operations have not been described in detail in order not to unnecessarily obscure the present embodiments.

Figure 1:
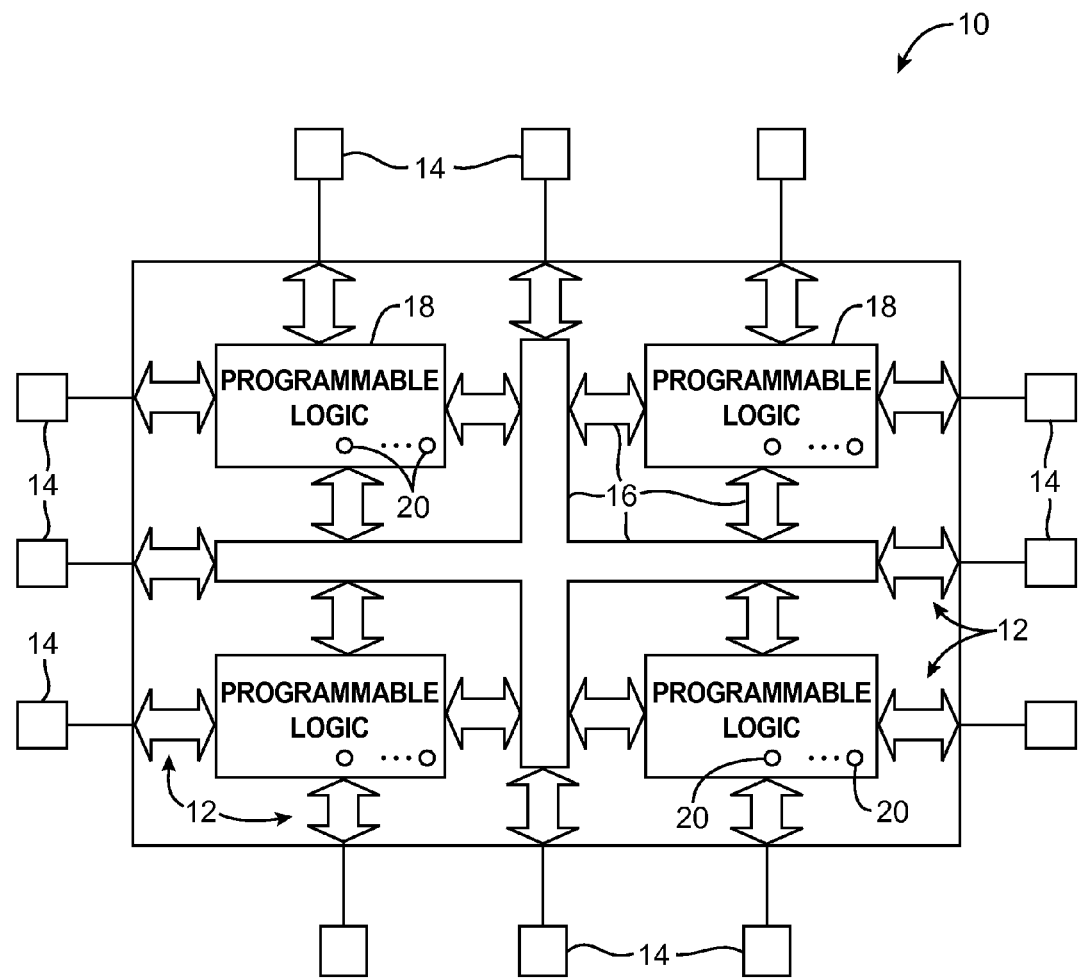
FIG. 1 is a diagram of an illustrative programmable integrated circuit in accordance with an embodiment of the present invention.

An illustrative integrated circuit of the type that may be provided with wireless communications capabilities is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry (programmable logic) 18.

Because memory elements 20 may be used in storing configuration data for programmable logic 18, memory elements 20 may sometimes be referred to as configuration random-access memory elements (CRAM). Integrated circuit 10 may be configured to implement custom logic functions by configuring programmable logic 18, so integrated circuit 10 may sometimes be referred to as a programmable integrated circuit.

As shown in FIG. 1, programmable integrated circuit 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, NAND gates, etc. P-channel transistors (e.g., a p-channel metal-oxide-semiconductor pass transistor) may also be controlled by output signals from memory elements 20, if desired. When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10. The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions.

The example of FIG. 1 in which device 10 is described as a programmable integrated circuit is merely illustrative and does not serve to limit the scope of the present invention. The method and apparatus described herein may be incorporated into any suitable circuit. In one suitable embodiment of the present invention, integrated circuits include wireless communications circuitry for supporting radio-frequency communications.

Figure 2:
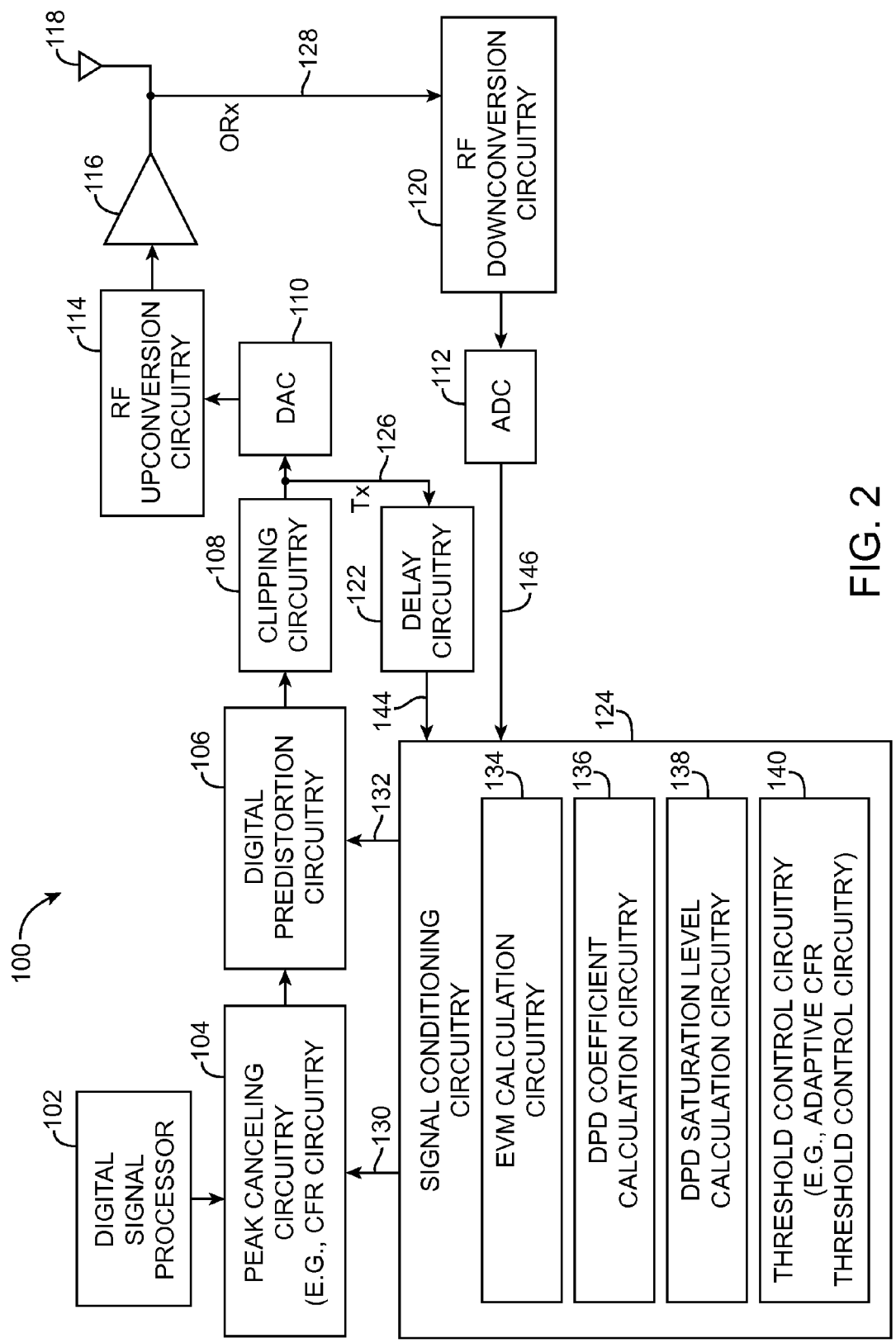
FIG. 2 is a diagram of illustrative wireless communications circuitry having signal conditioning circuitry for adjusting a crest factor reduction (CFR) threshold level in accordance with an embodiment of the present invention.

As shown in FIG. 2, wireless communications circuitry such as wireless communications circuitry 100 may include a digital signal processor 102 (e.g., a digital baseband processor), peak canceling circuitry such as peak canceller 104, digital predistortion (DPD) circuitry 106, hard clipping circuitry 108, converter circuitry such as digital-to-analog converter (DAC) circuitry 110 and analog-to-digital converter (ADC) circuitry 112, radio-frequency (RF) up-conversion circuitry 114, a radio-frequency amplifying circuit such as RF power amplifier 116, an antenna 118, RF down-conversion circuitry 120, delay circuitry 122, and signal conditioning circuitry 124.

Baseband processor 102 may be used to handle raw and processed data associated with wireless (antenna) performance metrics for received signals such as received power, transmitted power, frame error rate, bit error rate, channel quality measurements based on signal-to-interference ratio (SINR) and signal-to-noise ratio (SNR) information, channel quality measurements based on signal quality data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 100.

When wireless communications circuitry 100 is transmitting radio-frequency signals, processor 102 may generate digital data (e.g., baseband signals) that is fed to peak canceling circuitry 104 (sometimes referred to herein as "crest factor reduction" circuitry or CFR clipping circuitry). Peak cancelling circuitry 104 may be used to reduce the dynamic range of the baseband signals (e.g., for performing crest factor reduction (CFR) operations). For example, wireless communications systems that support non-constant envelope schemes such as the Wideband Code Division Multiple Access (W-CDMA) modulation scheme and the Orthogonal Frequency-Division Multiplexing (OFDM) modulation scheme and other wireless communications systems often generate signals having high peak-to-average ratios (PARS).

Digital signal waveforms (e.g., waveforms having relatively high peak-to-average ratios) that are received by peak canceling circuitry 104 from processor 102 may exhibit unwanted signal magnitude peaks that exceed a predetermined magnitude threshold level. Peak canceling circuitry 104 may monitor waveforms received from processor 102 to detect when the waveforms exceed the predetermined magnitude threshold level (sometimes referred to herein as a crest factor reduction (CFR) threshold value, CFR threshold level, clipping value, clipping level, CFR clipping value, or CFR clipping level). Peak cancellation circuitry 112 may serve to remove any undesired peaks in signals (waveforms) received from processor 102 prior to wireless transmission, which helps to reduce PAR and increase the efficiency of power amplifier 116. Signals generated at the output of peak cancelling circuitry 104 (e.g., peak-canceled baseband signals) may be fed through DPD circuitry 106, clipping circuitry 108, DAC 110, RF up-conversion circuitry 114, and power amplifier 116 to antenna 118 for wireless transmission.

Processor 102, peak canceling circuitry 104, and digital predistortion circuitry 106 may process digital signals at the baseband. Digital-to-analog converter circuitry 110 may convert digital baseband signals to analog signals at the baseband. Power amplifier 116 is sometimes considered to be part of a radio-frequency front end module that transmits analog signals at radio-frequency bands. Analog baseband signals may be up-converted to radio-frequency bands using RF up-conversion circuitry 114.

The circuitry shown in FIG. 2 is merely illustrative and does not serve to limit the scope of the present invention. Antenna 118 may also be coupled to receiver circuitry (not shown) for processing signals received using antenna 118. The RF front end module may also include circuitry such as matching circuits, band-pass filters, mixers (e.g., frequency up-converters and down-converters), low noise amplifiers (LNAs), data converters (e.g., digital-to-analog converters and analog-to-digital converters), and other circuitry for processing signals that are transmitted and received via antenna 12.

Ideally, radio-frequency power amplifier 116 exhibits a perfectly linear power response (e.g., a linear response in which any increase in input power fed to an input of amplifier 116 results in a corresponding increase in output power by a predetermined amount at the output of amplifier 116). It is, however, challenging to manufacture power amplifiers that exhibit perfectly linear power transfer characteristics. In practice, increases in input power levels may not always increase the output power by the predetermined amount (e.g., in practice, power amplifiers such as amplifier 116 may exhibit non-linear behavior). This undesired deviation may result in a reduction in the gain provided by the power amplifier at excessive input power levels and may therefore sometimes be referred to as gain compression. In general, radio-frequency power amplifier 116 in device 10 may exhibit gain compression and/or may deviate from the ideal transfer characteristic in any other way.

To counteract such types of undesirable non-linear behavior, digital predistortion (DPD) circuitry 106 may be used to introduce signal distortion that compensates for undesired deviation(s) from the ideal power transfer characteristic. DPD circuitry 106 may counteract the gain compression exhibited by power amplifier circuitry 116 by modeling an expansion function for the signals received from circuitry 104 (e.g., an expansion function that is computed based on an inverse of the compression of power amplifier 116). DPD circuitry 106 may, for example, include a digital predistortion filter having a first input configured to receive peak-canceled baseband signals from peak canceling circuitry 104, a second input that receives control signals from signal conditioning circuitry 124, and an output on which a predistorted version of the baseband signals (sometimes referred to as predistorted signals) is provided to clipping circuitry 108. As an example, DPD 106 may include filters such as a finite impulse response (FIR) filter that is used to convolve the baseband signals received at its first input with a control signal impulse response received at its second input. The impulse response may be represented using filter coefficients (sometimes referred to as "tap weights" or expansion coefficients). The amount or type of predistortion introduced by circuitry 106 may depend on the coefficients received from signal conditioning circuitry 124.

DPD circuitry 106 may pass predistorted signals to clipping circuitry 108 (sometimes referred to herein as hard clipping circuitry). Clipping circuitry 108 may compare the predistorted signal to a predetermined threshold magnitude and may clip the predistorted signal if the predistorted signal magnitude is greater than the predetermined threshold magnitude. If desired, the predetermined threshold may be actively adjusted.

DAC 110 may receive clipped predistorted signals from clipping circuitry 108. In another suitable arrangement, clipping circuitry 108 may pass unclipped predistorted signals to DAC 110 without performing any clipping. In yet another suitable arrangement, circuitry 100 may be formed without clipping circuitry 108 so that DPD circuitry 106 passes predistorted signals directly to DAC 110. DAC 110 may perform digital-to-analog conversion on the predistorted signals and may pass analog predistorted signals to RF up-conversion circuitry 114. Up-conversion circuitry 114 may up-convert the predistorted signals from baseband to radio-frequencies. Up-conversion circuitry 114 may pass the up-converted and predistorted signals to an input of amplifier 116.

Power amplifier 116 may generate an amplified version of the received predistorted signals and may pass the amplified signals to antenna 118. Due to non-idealities associated with power amplifier 116, the predistorted signal is not only amplified but is also distorted by the non-linear power transfer characteristic of power amplifier 116. If predistortion circuitry 106 is properly set (e.g., based on control signals provided by signal conditioning circuitry 124), signals generated at the output of power amplifier 116 will produce a frequency response that is substantially similar to that of the desired frequency response of the original signal prior to predistortion and amplification. In general, predistortion can be used to correct for any undesired magnitude and phase deviations associated with power amplifier 116, thereby improving power amplifier efficiency and wireless performance.

Signal conditioning circuitry 124 may adjust peak canceling circuitry 104 and DPD circuitry 106 to condition baseband signals provided by processor 102 for transmission. If desired, signal conditioning circuitry 124 may provide control signals to peak canceling circuitry 104 over path 130 for adjusting the peak magnitude threshold level implemented by circuitry 104. Signal conditioning circuitry 124 may provide control signals such as filter coefficients to digital predistortion circuitry 106 over path 132 for adjusting the predistortion applied by circuitry 106. If desired, signal conditioning circuitry 124 may include error monitoring circuitry such as error vector magnitude (EVM) calculation circuitry 134, digital predistortion coefficient calculation circuitry 136, digital predistortion saturation level calculation circuitry 138, and threshold control circuitry (e.g., adaptive crest factor reduction threshold control circuitry) such as threshold control circuitry 140 for adaptively controlling the peak magnitude threshold level imposed by peak canceling circuitry 104.

Conditioning circuitry 124 may monitor the performance of wireless communications circuitry 100 and may actively adjust peak canceling circuitry 104 and/or DPD circuitry 106 based on the real-time performance of circuitry 100. For example, signal conditioning circuitry 124 may actively characterize the power transfer response of RF power amplifier 116 and may generate filter coefficients and/or adjust the CFR threshold level implemented by circuitry 104 based on the power transfer response of amplifier 116 and/or any other desired performance metrics associated with communications circuitry 100. In one suitable arrangement, signal conditioning circuitry 124 may instruct peak canceling circuitry 104 to implement a first CFR threshold level and may instruct peak canceling circuitry 104 to implement a second CFR threshold level once signal conditioning circuitry 124 determines that power amplifier circuitry 116 has insufficient performance.

In order to properly characterize the power transfer response of RF power amplifier 116 for adjusting CFR threshold levels, signal conditioning circuitry 124 has to compare signals at the input of power amplifier 116 (i.e., signals Tx provided at path 126) to signals at the output of power amplifier 116 (i.e., signals ORx provided at path 128). Signals output by amplifier 128 may be passed to RF down-conversion circuitry 120 for conversion to a baseband frequency and may be passed to ADC 112 for conversion to digital signals before being passed to signal conditioning circuitry 124 over feedback path 124 (e.g., signals received by conditioning circuitry 124 over path 146 may sometimes be referred to herein as feedback signals).

Signals ORx generated at output 128 of power amplifier 116 exhibit not only amplified magnitudes but are also delayed in time with respect to the Tx signals. Any amount of time difference (e.g., phase delay) between the Tx and ORx signals should be reduced so that the two signals can be properly compared. Delay circuitry 122 may be used to align the Tx and ORx signals so that any difference observed during the comparison of the input and output power amplifier signals is only reflective of the linearity and not the phase delay associated with power amplifier 116. Delay circuitry 122 may pass delayed signals to conditioning circuitry 124 over delay path 144 that are aligned in time with the feedback signals received by conditioning circuitry 124 over feedback path 146.

Signal conditioning circuitry 124 may analyze delayed signals received from delay circuitry 122 and feedback signals received from ADC 112 to determine the power transfer characteristic of power amplifier 116. Conditioning circuitry 124 may generate coefficients that model the inverse of the power transfer characteristic associated with amplifier 116. Coefficients generated by circuitry 124 may be conveyed to DPD circuitry 106 via path 132 and may be used by DPD circuitry 106 to predistort the forward path transmit signals received from peak canceling circuitry 104 in a way that compensates for any detected non-linearity associated with power amplifier 116.

Figure 3:
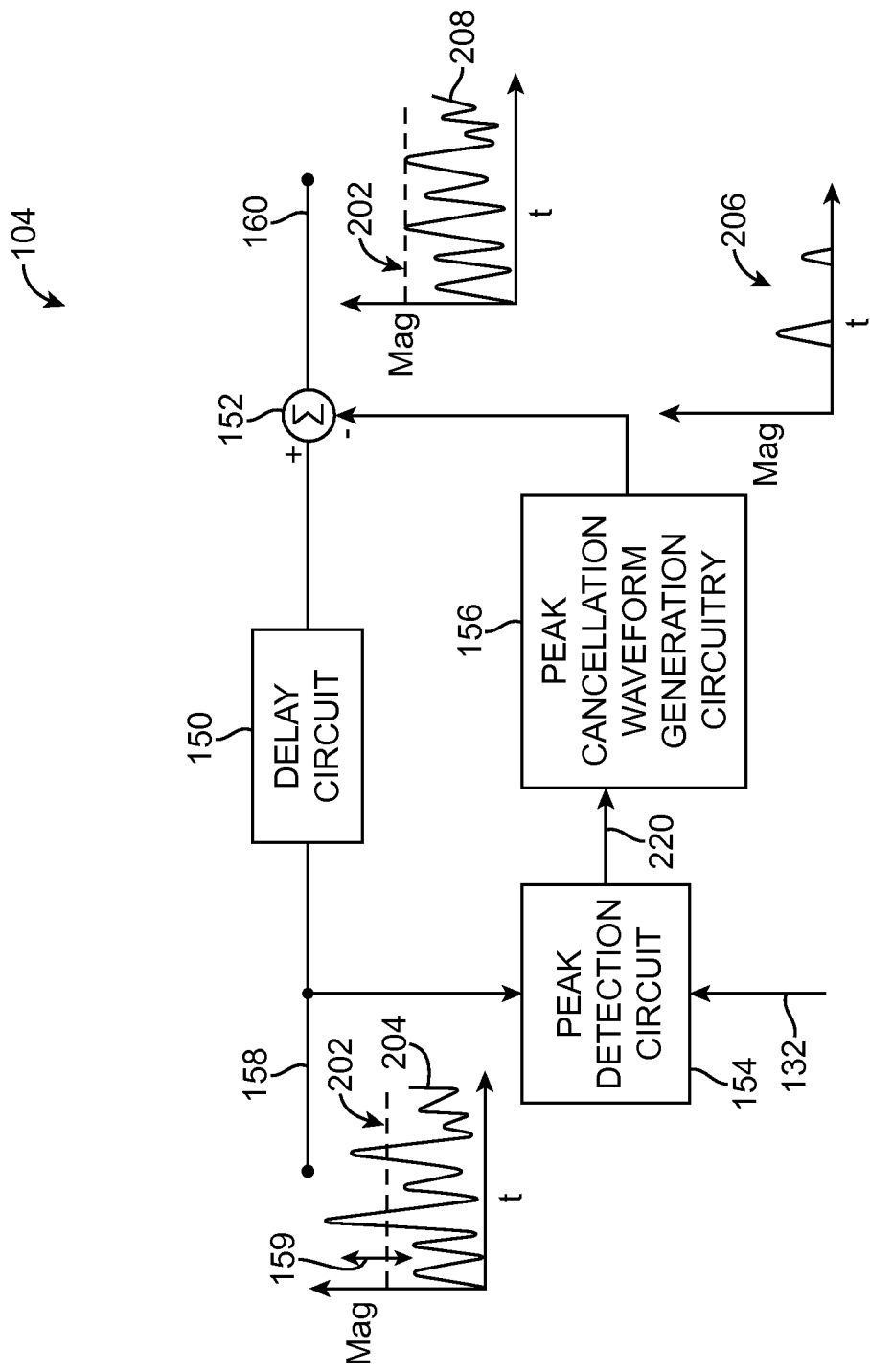
FIG. 3 is a diagram of illustrative peak cancelling circuitry that imposes an adjustable crest factor reduction threshold level on incoming signals in accordance with an embodiment of the present invention.

If desired, signal conditioning circuitry 124 may optimize the performance of wireless communications circuitry 100 by actively adjusting the CFR threshold level implemented by peak canceling circuitry 104. FIG. 3 is a general block diagram of peak cancellation circuitry 104. As shown in FIG. 3, circuitry 104 may include at least a peak detection circuit 154, peak cancellation waveform generation circuitry 156, a subtraction circuit 152, and a delay circuit 150. Circuitry 104 may have an input terminal 158 that receives an input waveform from processor 102 (see, e.g., input waveform 204 in the example of FIG. 3).

Waveform 204 may exhibit unwanted peaks that exceed a predetermined magnitude threshold level (CFR threshold level) 202. Peak detection circuit 154 may be used to monitor input waveform 204 to detect when waveform 204 exceeds CFR threshold level 202. For example, peak detection circuit 154 may temporarily provide asserted control signals to peak cancellation waveform generation circuitry 200 via path 220 in response to detecting an unwanted signal peak. Peak cancellation waveform generation circuitry 200 may serve to output a peak cancellation waveform such as waveform 206 containing signal impulses with magnitudes that are proportional to the amount by which the unwanted peaks exceed level 202. Peak detection circuit 154 may receive control signals generated by signal conditioning circuitry 124 over input path 132. Control signals received over path 132 may identify a particular CFR threshold level 202 for comparing with waveform 204. Control signals received over path 132 may instruct detection circuit 154 to adjust peak magnitude threshold level 202 (e.g., so that threshold level 202 increases or decreases in magnitude, as shown by arrows 159).

Subtractor 152 may have a first (positive) input that receives a delayed version of input waveform 204 via delay circuit 150, a second (negative) input that receives peak cancelling waveform 206 from circuitry 200, and an output on which an output waveform 208 is provided. The output of subtraction circuit 152 may serve as an output terminal 160 for circuitry 104. Output waveform 208 may be generated by subtracting cancelling waveform 206 received at the second input of circuit 152 from the delayed input waveform received the first input of circuit 152. As shown in FIG. 3, output waveform 208 may be a clipped version of input waveform 204 (e.g., output waveform 208 is substantially identical to input waveform 204 except waveform 208 does not exceed threshold level 202). Cancelling unwanted signal peaks using this approach can allow higher average signal power to be transmitted before saturation occurs.

Predistortion circuitry 106 may counteract gain compression associated with power amplifier 116 by modeling gain expansion functions (sometimes referred to herein as expanding functions) that compensate for the gain compression associated with amplifier 116 (e.g., using coefficients received from conditioning circuitry 124). As described above in connection with FIG. 3, peak canceling circuitry 104 imposes peak magnitude threshold level 202 in order to reduce the Peak-to-Average (PAR) ratio of signals received from processor 102. However, predistortion circuitry 106 often increases PAR of the received signals because circuitry 106 performs gain expansion on the received signals. Performing gain expansion on the received signals can alter the frequency distribution of the signals. If care is not taken, predistortion circuitry 104 may introduce additional peak power levels to the signal that are above the CFR threshold level imposed by peak canceling circuitry 104, which can damage power amplifier circuitry 116 or other circuitry on circuit 10, introduce undesirable phase distortion to the signal, or introduce quantization noise generated by DAC circuitry 110.

Figure 4:
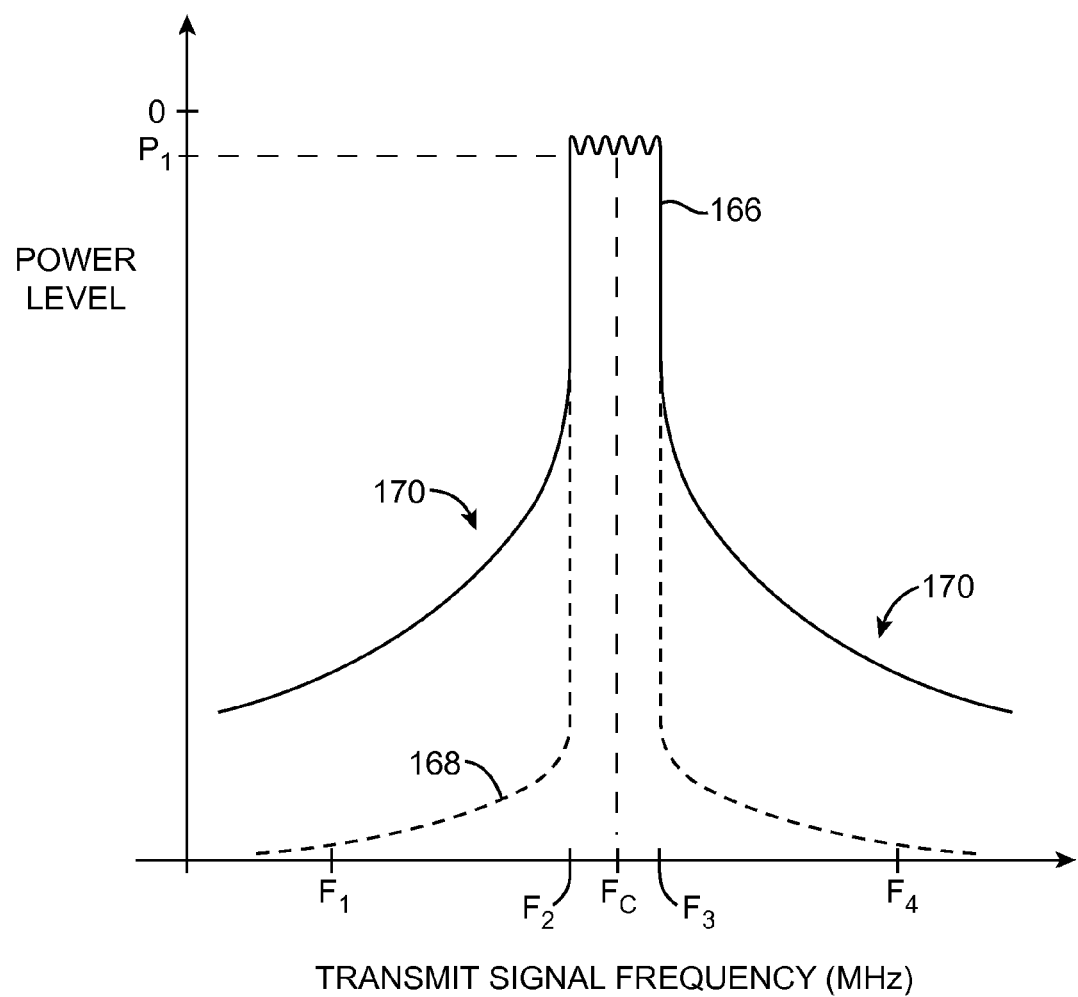
FIG. 4 is an exemplary diagram plotting input and output power level versus signal frequency of digital predistortion circuitry in accordance with an embodiment of the present invention.

In some scenarios, hard clipping circuitry 108 may perform hard clipping on the signals processed by DPD circuitry 106 to mitigate the increase in PAR provided by DPD circuitry 106. FIG. 4 is an illustrative graph showing how performing hard clipping on signals received from DPD 106 may cause undesired spectral regrowth that can degrade the performance of wireless communications circuitry 100.

Curve 168 represents the input power level of signals provided to power amplifier 116 as a function of frequency. As shown in FIG. 4, signals are provided to amplifier 116 centered around frequency $F_C$ (e.g., amplifier 116 receives signals in a frequency band between $F_2$ and $F_3$). Curve 166 represents the output power level of signals that have been amplified by amplifier 116 and clipped using hard clipping circuitry 108. Performing hard clipping on input signals 168 may generate undesired output power outside of the frequency band of the input signals (e.g., as shown by shoulders 170 at frequencies less than $F_2$ and greater than $F_3$). Out-of-band output power may sometimes be referred to herein as spectral regrowth or spectral mask violation. Spectral regrowth 170 can sometimes degrade the performance of power amplifier circuitry 116.

If desired, signal conditioning circuitry 124 may adaptively adjust CFR threshold levels imposed by peak canceling circuitry 104 in order to avoid hard clipping the output of DPD 106 with clipping circuitry 108, thereby mitigating spectral regrowth. Signal conditioning circuitry 124 may adjust the CFR threshold levels based on the operating characteristics of power amplifier circuitry 116 and DPD circuitry 106 in real time.

Figure 5:
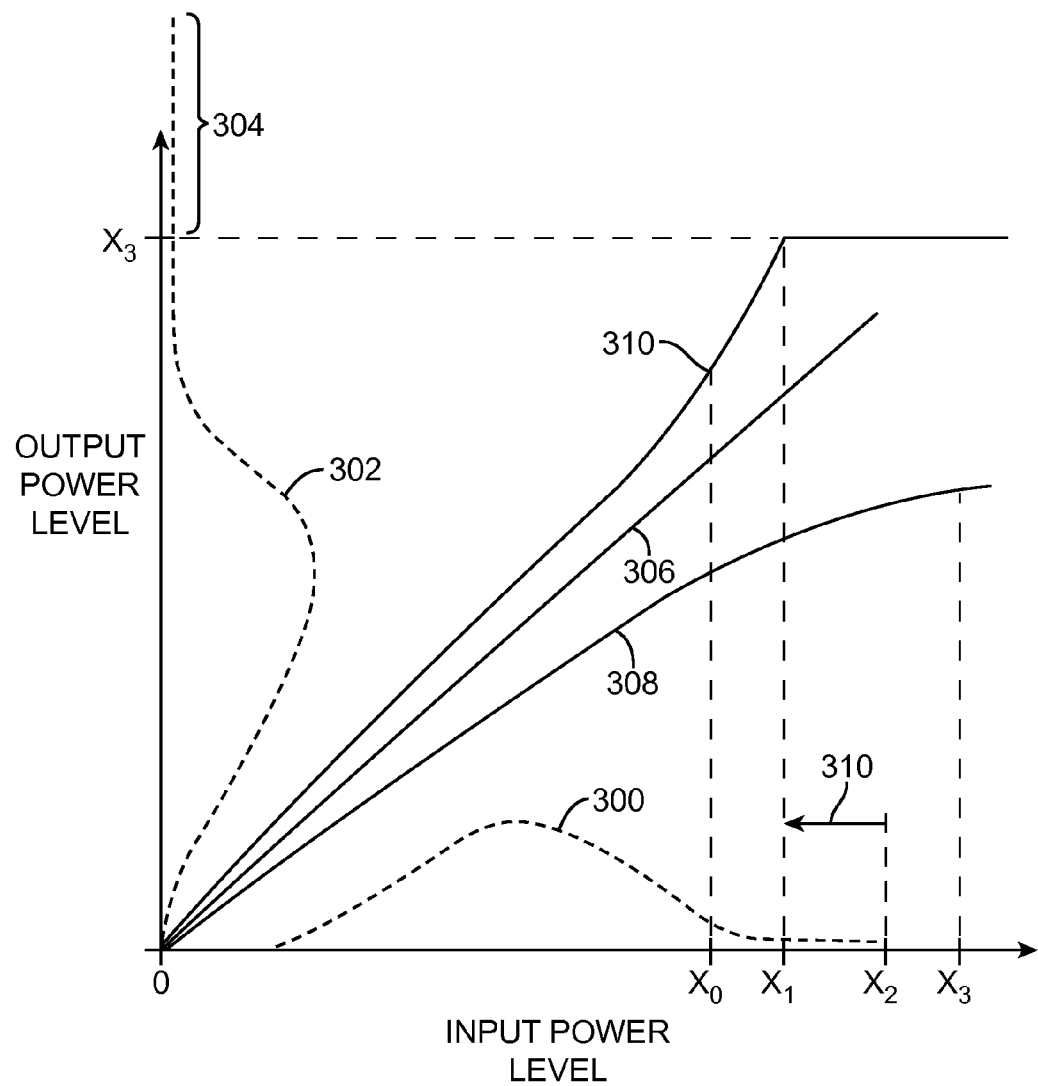
FIG. 5 is an exemplary diagram plotting output power level versus input power level of a radio-frequency power amplifier and digital predistortion circuitry and plotting input and output power density functions of the digital predistortion circuitry in accordance with an embodiment of the present invention.

FIG. 5 is a an illustrative graph showing how a CFR threshold level may be adjusted based on the characteristics of power amplifier 116 and DPD circuitry 106 to mitigate non-linearity associated with power amplifier 116 while minimizing the risk of damaging amplifier 116. As shown in FIG. 5, curve 300 illustrates a probability distribution function (PDF) of the amplitude (magnitude) of signals received by DPD circuitry 106 from peak canceling circuitry 104. Curve 302 illustrates a PDF of the amplitude of signals output by DPD circuitry 106 after performing predistortion operations. DPD circuitry 106 may increase the peak-to-average ratio of the received signals, generating excessive magnitude peaks in the signals as illustrated by tail portion 304 of curve 302. Signal magnitude peaks associated with tail portion 304 may be above the CFR threshold imposed by peak canceling circuitry 104 and can damage power amplifier circuitry 116.

Response line 306 of FIG. 5 may illustrate an ideal power characteristic of power amplifier 116, whereas line 308 may illustrate an actual power characteristic of the power amplifier in practice. As shown in FIG. 5, line 306 may exhibit a constant slope across all input power levels (i.e., any increase in input power results in a corresponding increase in output power by a predetermined amount). In practice, as shown by line 308 in FIG. 5, the slope of line 308 may deviate from the desired slope of line 306 after a certain power level $X_0$. This undesired deviation may result in a reduction in the gain provided by the power amplifier at input power levels greater than $X_0$ (e.g., power amplifier 116 may exhibit gain compression for input power levels greater than $X_0$).

To counteract gain compression exhibited by power amplifier 116, DPD circuitry 106 may be used to introduce signal distortion that compensates for undesired deviation(s) from the ideal power transfer characteristic. As shown in FIG. 5, line 310 may illustrate the actual power characteristic of predistortion circuit 106. For all signals that are received with DPD circuit 106 and that have power levels that are less than or equal to $X_0$, these signals may be passed through to the output of the predistortion circuit without any amplification nor attenuation. For all signals that are received with predistortion circuit 106 and that have power levels greater than $X_0$, these signals may be provided with an appropriate amount of gain to compensate for the gain compression associated with the power amplifier as shown by line 308 (e.g., line 310 may model an expansion function that is an inverse of the compression function illustrated by line 308).

During operation, signal conditioning circuitry 124 may instruct peak canceling circuitry 104 to impose an initial CFR threshold level $X_2$ on signals received from processor 102. In this scenario, portions of PDF 300 that are greater than power level $X_2$ may be clipped by circuitry 104 prior to being received at the input of DPD circuitry 106. During operation of communications circuitry 100, signal conditioning circuitry 124 may monitor the performance (e.g., transfer characteristic) of power amplifier 116 and/or DPD circuitry 106 to optimize the CFR threshold level and may instruct peak canceling circuitry 104 to shift the CFR threshold level from power level $X_2$ to an updated power level $X_1$ as illustrated by arrow 310. By adjusting the CFR threshold level imposed by peak canceling circuitry 104, DPD circuitry 106 may eliminate tail portion 304 from output PDF curve 302 (e.g., tail 304 may be eliminated from output PDF 302 associated with DPD 106 when the CFR threshold is shifted to $X_1$). Spectral regrowth 170 as shown in FIG. 4 may thereby be minimized.

As shown in FIG. 5, power amplifier 116 may reach a power amplifier saturation level (e.g., a level at which increases in input power level no longer generate an increase in output power level) at power level $X_3$. Signal conditioning circuitry 124 may adjust the characteristic (e.g., impulse coefficients) of DPD circuitry 106 so that the output of DPD circuitry 106 matches or is just below the input saturation level of power amplifier 116 (e.g., so that power amplifier 116 has a maximum output power without reaching saturation). Signal processing circuitry 124 may provide control signals such as filter coefficients to DPD circuitry 106 to provide DPD circuitry 106 with an optimized characteristic that matches the output power level of DPD circuitry 106 to the input saturation level of power amplifier 116.

In the example of FIG. 5, signal conditioning circuitry 124 may instruct digital predistortion circuitry 106 to exhibit a characteristic as shown by line 310. DPD circuitry 106 has a maximum output power level that corresponds to the saturation level of power amplifier 116 (e.g., DPD circuitry 106 has a maximum output power level of $X_3$). Signal conditioning circuitry 124 may calculate an input saturation level for DPD circuitry 106 that corresponds to the input saturation level of power amplifier 116 (e.g., an input power level to DPD circuitry 106 that produces saturation on power amplifier circuitry 116). In the example of FIG. 5, conditioning circuitry 124 may determine that DPD circuitry 106 has an input saturation level of $X_1$ (e.g., an input of $X_1$ that corresponds to saturation level $X_3$ of power amplifier circuitry 116). DPD input saturation level $X_1$ may be used to compute the optimal CFR threshold level for peak canceling circuitry 104.

For example, the optimal (target) CFR threshold level may be set equal to the input power level associated with saturation of DPD circuitry 106, which in turn corresponds to the saturation level of power amplifier circuitry 116 (e.g., the optimal CFR threshold level may be set equal to the input power level of DPD circuitry 106 that produces an DPD output power level equal to the saturation level of power amplifier circuitry 116). In this way, signal conditioning circuitry 130 may maximize the average power and efficiency of power amplifier 116 without introducing spectral regrowth in the transmit signals.

Figure 6:
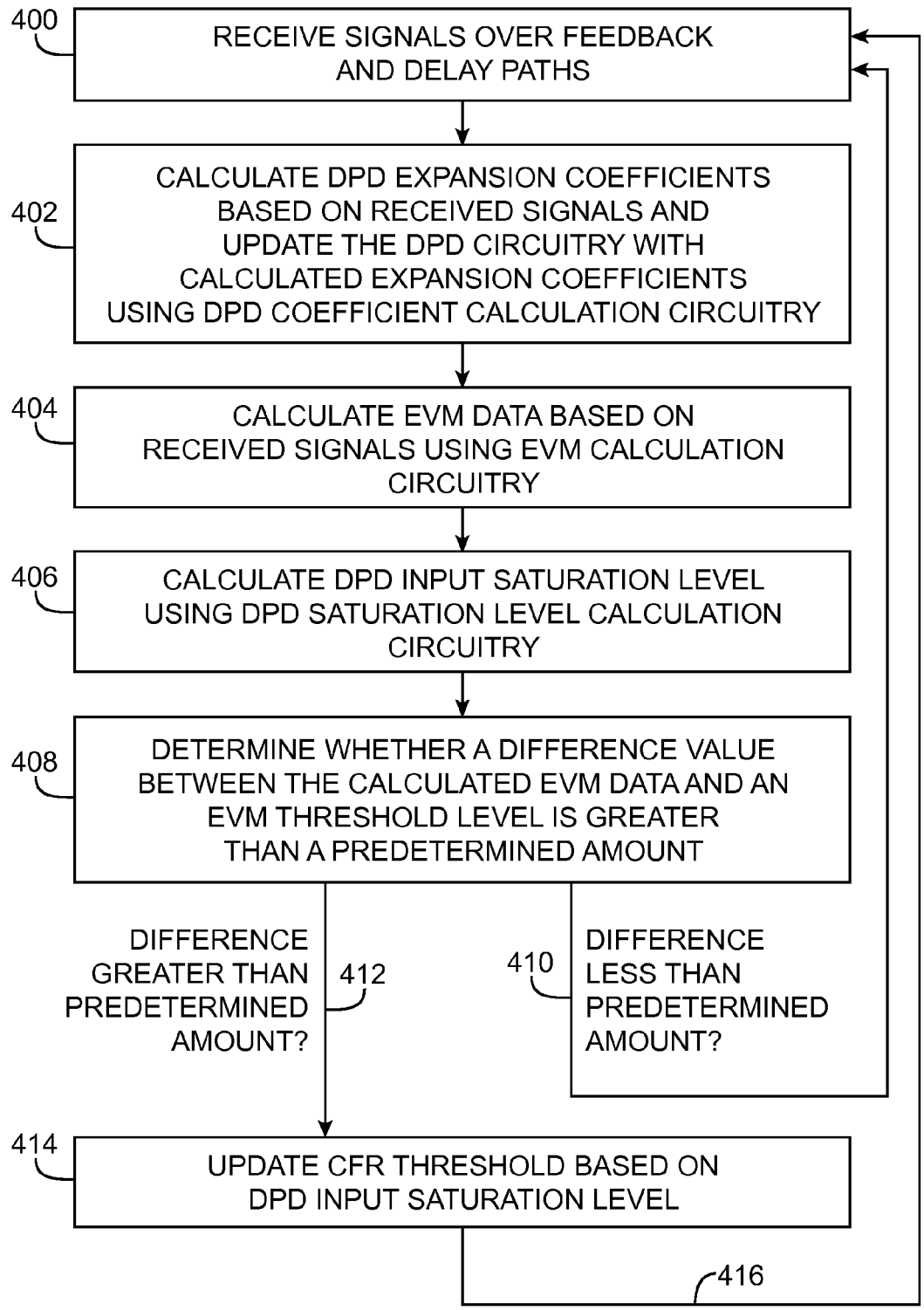
FIG. 6 is a flow chart of illustrative steps involved in using signal conditioning circuitry of the type shown in FIG. 2 to adjust peak canceling circuitry and digital predistortion circuitry based on the operating conditions of a radio-frequency power amplifier in accordance with an embodiment of the present invention.

FIG. 6 is a flow chart of illustrative steps that may be performed by signal conditioning circuitry 124 to optimize the CFR threshold imposed by peak canceling circuitry 104. The steps of FIG. 6 may, for example, allow signal conditioning circuitry 124 to maximize performance of amplifier circuitry 116 without introducing out-of-band spectral regrowth to the transmit signals.

At step 400, signal conditioning circuitry 124 may receive signals over feedback path 146 and delay path 144 (as shown in FIG. 2). If desired, DPD coefficient calculation circuitry 136 in conditioning circuitry 124 may receive delayed signals from delay circuitry 122 over delay path 144 and may receive feedback signals from ADC 112 over feedback path 146. EVM calculation circuitry 134 may receive feedback signals from ADC 112 over feedback path 146.

At step 402, DPD coefficient calculation circuitry 136 may compute expansion coefficients for DPD circuitry 106 based on the delay signals received via path 144 and the feedback signals receive via 146. The DPD expansion coefficients may model an inverse of the gain compression provided by amplifier 116 (e.g., the expansion coefficients may provide DPD circuitry 106 with a response curve as shown by line 310 in FIG. 5). As an example, DPD coefficient calculation circuitry 136 may include matrix inversion circuitry for performing a division operation to generate the coefficients associated with the impulse response of DPD 106. The impulse response coefficients may be conveyed from signal conditioning circuitry 124 to DPD circuitry 106 via path 132. DPD circuitry 106 may perform predistortion operations on signals received from peak canceling circuitry 104 based on the received expansion coefficients (e.g., DPD coefficient calculation circuitry 136 may update the coefficients implemented by DPD circuitry 106 using the calculated expansion coefficients).

At step 404, EVM calculation circuitry 134 may compute performance metric values such as error vector magnitude (EVM) values for feedback signals received over feedback path 146 as shown in FIG. 2. The EVM values may, for example, be indicative of the performance of power amplifier 116 or other portions of wireless communications circuitry 100. EVM calculation circuitry 134 may pass the EVM values to threshold control circuitry 140.

At step 406, DPD saturation level calculation circuitry 138 may compute an input saturation level for DPD circuitry 106 based on the delayed signals received over path 144, the feedback signals received over path 146, and/or the DPD expansion coefficients generated by DPD coefficient calculation circuitry 136. If desired, saturation level calculation circuitry 138 may calculate a desired CFR threshold level based on the characteristics of DPD circuitry 106. In the example of FIG. 5, DPD saturation level calculation circuitry may identify DPD input saturation level $X_1$ associated with DPD characteristic curve 310. DPD saturation level calculation circuitry 138 may pass the computed DPD input saturation level to threshold control circuitry 140. The example of FIG. 6 in which conditioning circuitry 124 generates EVM values prior to calculating DPD input saturation levels is merely illustrative. If desired, step 404 may be performed prior to step 402, after step 406, concurrently with step 404, concurrently with step 406, or at any other desired time.

At step 408, threshold control circuitry 140 may identify a predetermined EVM requirement value. The EVM requirement value may be specified by carrier-imposed requirements, a user of communications circuitry 100, design requirements, manufacturing requirements, regulatory requirements, or any other suitable requirements associated with the performance of communications circuitry 100. Threshold control circuitry 140 may generate a difference value between the EVM requirement value and the EVM values computed by EVM calculation circuitry 134. Threshold control circuitry 140 may determine whether the difference value is greater than a predetermined value (e.g., a predetermined margin). If threshold control circuitry 140 determines that the difference value is less than or equal to the predetermined value, processing may loop back to step 400 as shown by path 410 to receive and process additional signals. In this way, threshold control circuitry 140 may omit adjustments for the CFR threshold level when EVM values are sufficiently close to the EVM requirement value (e.g., when the performance of communications circuitry 100 is satisfactory).

If threshold control circuitry 140 determines that the difference value is greater than the predetermined value (e.g., if EVM values having insufficient magnitude or magnitudes that vary significantly with respect to the EVM requirement value are calculated), processing may proceed to step 414 as shown by path 412. At step 414, threshold control circuitry 140 may compute an updated CFR threshold value based on characteristics associated with DPD circuitry 106. For example, threshold control circuitry 140 may compute an updated CFR threshold value (level) for peak canceling circuitry 104 based on the DPD input saturation level and may instruct peak canceling circuitry 104 to implement the updated CFR threshold value (e.g., threshold control circuitry 140 may update the CFR threshold value implemented at peak canceling circuitry 104).

As an example, threshold control circuitry 140 may iteratively compute the updated CFR threshold value based on the current CFR threshold value (e.g., the CFR threshold value currently imposed by peak canceling circuitry 104), the DPD input saturation level (e.g., a desired CFR threshold value), and an updating constant. In this scenario, threshold control circuitry 140 may compute the updated CFR threshold value as a weighted sum (e.g., a linear combination) of the current CFR threshold value and the DPD input saturation level (e.g., the DPD saturation level as computed at step 406). For example, the updated CFR threshold value may be computed using the following equation:

$$C'=(1\times\mu)*C+\mu*D$$

where C' is the updated CFR threshold value, C is the current CFR threshold value, D is the computed DPD input saturation level, and $\mu$ is an updating constant (e.g., a constant value between 0 and 1). Threshold control circuitry 140 may convey control signals to peak canceling circuitry 104 that instruct circuitry 104 to implement the updated CFR threshold value (e.g., instructions to set peak magnitude threshold level 202 of FIG. 3 to a value of C').

Processing may subsequently loop back to step 400 as shown by path 416. In this way, signal conditioning circuitry 124 may continue to monitor the performance of communications circuitry 100 and may iteratively update the CFR threshold value based on the performance of communications circuitry 100. In practice, the performance of amplifier circuitry 116 (e.g., the linearity of amplifier circuitry 116) may change during normal operation of circuitry 100 due to temperature changes, frequency or channel changes, bandwidth changes, aging, or other changes to the operating conditions of circuitry 100. By adaptively updating the CFR threshold value based on the DPD and power amplifier characteristics (e.g., based on the DPD saturation level, which is in turn based on the inverse of the characteristics of power amplifier 116), signal conditioning circuitry 124 may maximize the power output by power amplifier 116 while minimizing potentially damaging out-of-band signal regrowth (e.g., spectral regrowth such as shoulders 170 as shown in FIG. 4) for a wide range of device operating conditions.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. Circuitry, comprising:
   peak canceling circuitry that receives signals and that clips peaks in the signals that exceed a magnitude threshold value to generate peak-canceled signals;
   predistortion circuitry that performs predistortion operations on the peak-canceled signals to generate predistorted signals;
   signal conditioning circuitry that adjusts the magnitude threshold value based on a power transfer characteristic of the predistortion circuitry;
   an amplifier having an input and an output, wherein the input of the amplifier receives the predistorted signals from the predistortion circuitry;
   a delay path coupled between the signal conditioning circuitry and the input of the amplifier; and
   delay circuitry interposed on the delay path.

2. The circuitry defined in claim 1, wherein the power transfer characteristic of the predistortion circuitry specifies an input saturation level of the predistortion circuitry and wherein the signal conditioning circuitry adjusts the magnitude threshold value based on the input saturation level of the predistortion circuitry.

3. The circuitry defined in claim 1, further comprising:
   a feedback path coupled between the output of the amplifier and the signal conditioning circuitry.

4. The circuitry defined in claim 3, wherein the signal conditioning circuitry comprises:
   filter coefficient calculation circuitry that analyzes signals on the delay path and the feedback path and that computes filter coefficients for the predistortion circuitry, wherein the predistortion circuitry predistorts the peak-canceled signals based on the filter coefficients.

5. The circuitry defined in claim 4, wherein the predistortion circuitry comprises:
   a finite impulse response filter that predistorts the peak-canceled signals based on the filter coefficients.

6. The circuitry defined in claim 1, wherein the power transfer characteristic specifies a saturation level of the predistortion circuitry and wherein the signal conditioning circuitry comprises:
   saturation level calculation circuitry that calculates the saturation level of the predistortion circuitry.

7. The circuitry defined in claim 6, wherein the signal conditioning circuitry further comprises:
   threshold control circuitry that generates an updated magnitude threshold value for the peak canceling circuitry based on the saturation level, wherein the signal conditioning circuitry adjusts the magnitude threshold value using the updated magnitude threshold value.

8. The circuitry defined in claim 7, wherein the signal conditioning circuitry further comprises:
   error calculation circuitry that calculates an error value and provides the error value to the threshold control circuitry.

9. The circuitry defined in claim 1, wherein the delay circuitry conveys signals to the signal conditioning circuitry.

10. The circuitry defined in claim 1, further comprising clipping circuitry coupled between the predistortion circuitry and the input of the amplifier, wherein the delay path is coupled between an output of the clipping circuitry and the signal conditioning circuitry.

11. A method for operating an integrated circuit, comprising:
    with peak cancelation circuitry, receiving transmit signals and clipping the transmit signals that exceed a peak magnitude threshold level;
    with predistortion circuitry, receiving the clipped transmit signals and predistorting the clipped transmit signals;
    with amplifier circuitry having an associated power transfer characteristic, receiving the predistorted transmit signals and amplifying the predistorted transmit signals;
    with signal conditioning circuitry, adjusting the peak magnitude threshold level based on the power transfer characteristic of the amplifier circuitry;
    with the signal conditioning circuitry, generating an error value associated with the amplified transmit signals;
    with the signal conditioning circuitry, determining whether a difference value between the generated error value and a threshold error value is greater than a predetermined amount; and
    with the signal conditioning circuitry, adjusting the peak magnitude threshold level in response to determining that the difference value between the generated error value and the threshold error value is greater than the predetermined amount.

12. The method defined in claim 11, further comprising:
    with the signal conditioning circuitry, identifying a saturation level associated with the power transfer characteristic of the amplifier circuitry.

13. The method defined in claim 12, further comprising:
- with the signal conditioning circuitry, determining a saturation level for the predistortion circuitry based on the saturation level associated with the power transfer characteristic of the amplifier circuitry; and
- with the signal conditioning circuitry, adjusting the peak magnitude threshold level based on the saturation level of the predistortion circuitry.

14. The method defined in claim 13, further comprising:
- with the signal conditioning circuitry, generating filter coefficients for the predistortion circuitry based on the power transfer characteristic of the amplifier circuitry; and
- with the predistortion circuitry, predistorting the clipped transmit signals based on the generated filter coefficients.

15. The method defined in claim 13, further comprising:
- with the signal conditioning circuitry, generating an updated peak magnitude threshold level based on the saturation level of the predistortion circuitry; and
- with the signal conditioning circuitry, instructing the peak cancelation circuitry to clip the transmit signals using the updated peak magnitude threshold level.

16. The method defined in claim 11, further comprising:
- with the signal conditioning circuitry, determining whether to adjust the peak magnitude threshold level based on the generated error value.

17. The method defined in claim 16, further comprising:
- with the signal conditioning circuitry, identifying a saturation level associated with the power transfer characteristic of the amplifier circuitry; and
- with the signal conditioning circuitry, adjusting the peak magnitude threshold level based on the identified saturation level in response to determining that the difference value between the generated error value and the threshold error value is greater than the predetermined amount.

18. A method for operating signal conditioning circuitry that is coupled to peak cancelation circuitry, digital predistortion circuitry, and amplifier circuitry, wherein the peak cancelation circuitry imposes a clipping value on transmit signals, the method comprising:
- with the signal conditioning circuitry, receiving first signals from an output of the digital predistortion circuitry and second signals from an output of the amplifier circuitry;
- with the signal conditioning circuitry, adjusting the clipping value imposed by the peak cancelation circuitry based on the first and second signals to prevent out-of-band spectral regrowth in the transmit signals;
- with the signal conditioning circuitry, generating a first clipping value based on the first and second signals;
- with the signal conditioning circuitry, generating a second clipping value as a linear combination of the first clipping value and an additional factor; and
- with the signal conditioning circuitry, instructing the peak cancelation circuitry to impose the second clipping value on the transmit signals.

19. The method defined in claim 18, wherein the digital predistortion circuitry receives the transmit signals from the peak cancelation circuitry, the method further comprising:
- with the signal conditioning circuitry, generating filter coefficients based on the first and second signals; and
- with the signal conditioning circuitry, instructing the digital predistortion circuitry to predistort the transmit signals based on the generated filter coefficients.

20. The method defined in claim 18, further comprising:
- with the signal conditioning circuitry, instructing the peak cancelation circuitry to impose the first clipping value on the transmit signals.

21. The method defined in claim 20, further comprising:
- with the signal conditioning circuitry, generating a third clipping value that is different from the first and second clipping values based on the first and second signals; and
- with the signal conditioning circuitry, instructing the peak cancelation circuitry to impose the third clipping value on the transmit signals.

22. The method defined in claim 21, further comprising:
- with the signal conditioning circuitry, generating the second clipping value as a linear combination of the first clipping value, the third clipping value, and the additional factor.

23. The circuitry defined in claim 18, wherein the additional factor comprises an input saturation level of the digital predistortion circuitry.

* * * * *